United States Patent [19]
Tonch et al.

[11] Patent Number: 5,805,639
[45] Date of Patent: Sep. 8, 1998

[54] ADAPTIVE NETWORK

[75] Inventors: Reiner Tonch, München; Lajos Gazsi, Düsseldorf, both of Germany; Ferenc Leeb, Villach, Austria

[73] Assignee: Siemens Aktiengesellschaft, Munich, Germany

[21] Appl. No.: 535,714

[22] Filed: Sep. 28, 1995

[30] Foreign Application Priority Data

Sep. 28, 1994 [DE] Germany .......................... 44 34 723.5

[51] Int. Cl.$^6$ .............................. H03H 7/30; H03H 7/40
[52] U.S. Cl. ..................... 375/232; 375/233; 375/317; 375/350; 364/724.2
[58] Field of Search .................. 375/229–234, 375/317, 350; 455/213, 307; 333/18, 28 R; 364/724.19, 724.2

[56] References Cited

U.S. PATENT DOCUMENTS

| 5,481,564 | 1/1996 | Kakuishi et al. | 375/232 |
| 5,499,268 | 3/1996 | Takahashi | 375/232 |
| 5,524,125 | 6/1996 | Tsujimoto | 375/232 |
| 5,581,585 | 12/1996 | Takatori et al. | 375/232 |

FOREIGN PATENT DOCUMENTS 0 098 748  1/1984  European Pat. Off. .
36 10 383  10/1987  Germany .

OTHER PUBLICATIONS

Publ. Introduction to Digital Signal Processing (Proakis et al.), pp. 858–877.
IEEE Publ. 1989, (Graf et al.), pp. 1808–1812, "Design and Performance of an All–Digital Adaptive . . . ".

Primary Examiner—Don N. Vo
Attorney, Agent, or Firm—Herbert L. Lerner; Laurence A. Greenberg

[57] ABSTRACT

An adaptive network includes a summation node for receiving an input signal and delivering an output signal. A decision unit receives the output signal of the summation node as an input signal and has an output for delivering an output signal being a differential signal between the input and output signals of the decision unit. An adaptive feedback branch receives the output signal of the decision unit and has status variables, coefficients and an output. A changeover switch unit couples the output of the feedback branch to the summation node. A monitoring unit monitors an error magnitude of the output signal of the decision unit. The monitoring unit triggers the changeover switch unit in the next clock cycle if a first signal value having an amplitude exceeding a certain threshold value appears, for causing the summation node to be acted upon by a digital zero signal, for setting the status variables of the feedback branch to zero and for freezing the coefficients of the feedback branch.

5 Claims, 1 Drawing Sheet

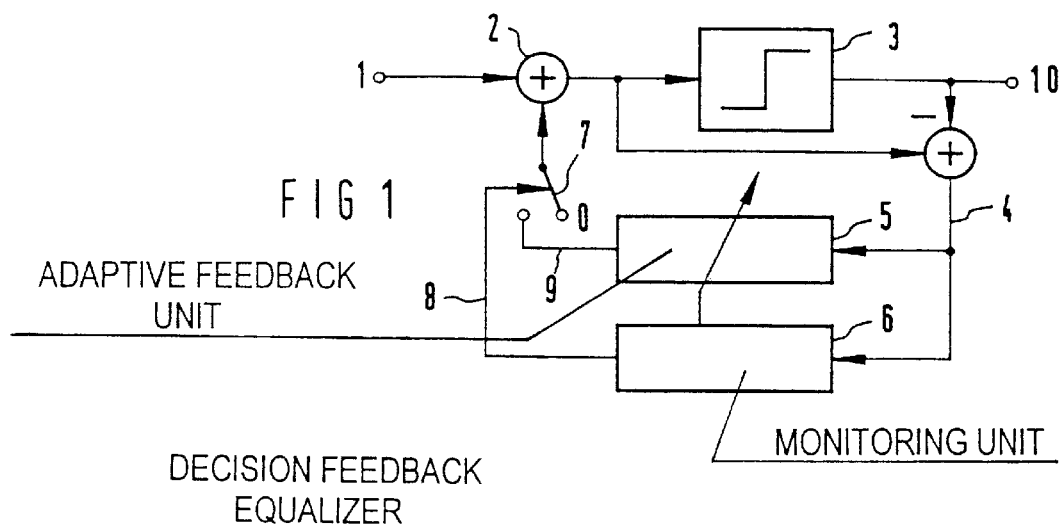
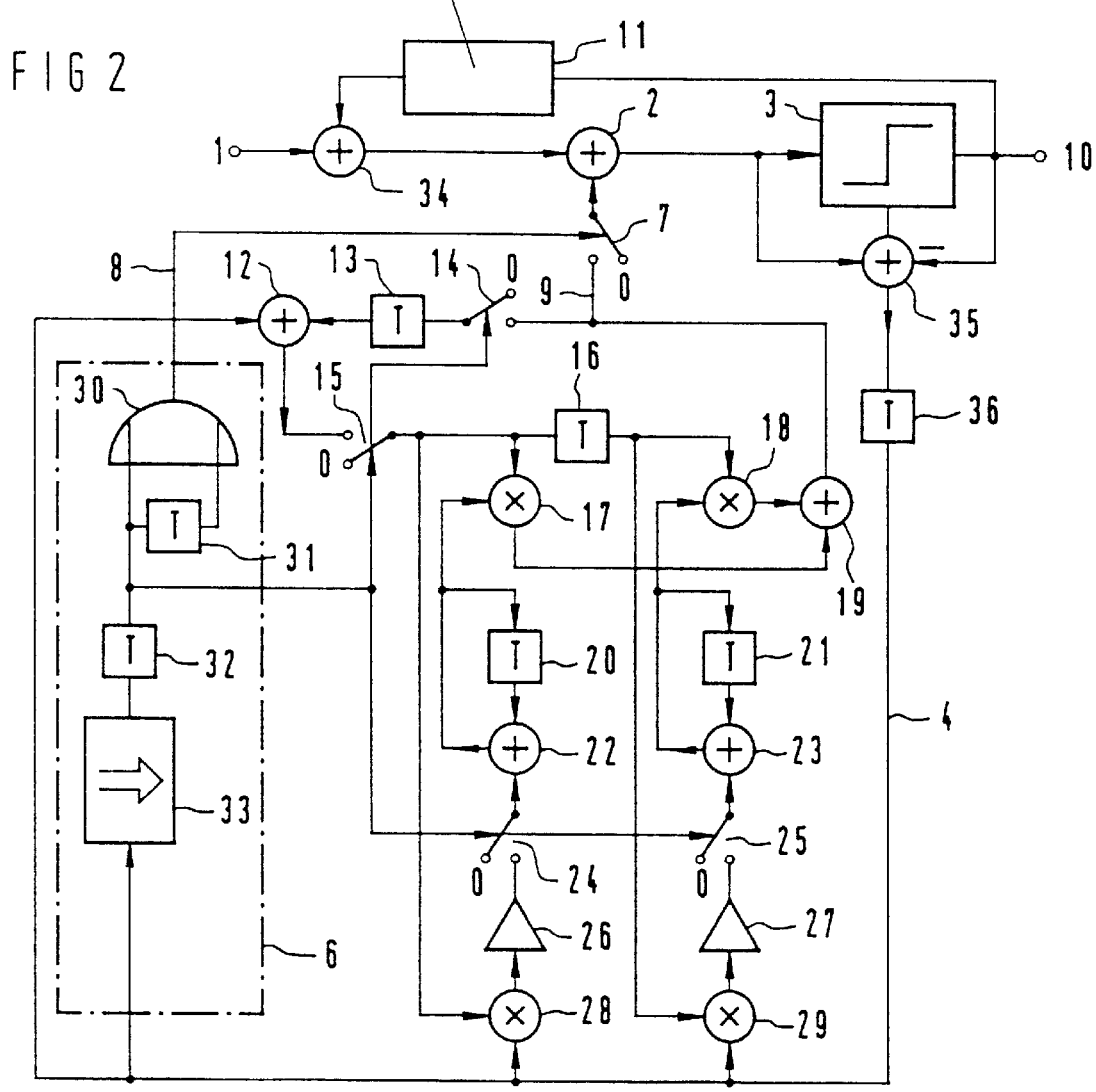

ADAPTIVE NETWORK

BACKGROUND OF THE INVENTION

1. Field of the Invention

The invention relates to an adaptive network having a summation node for receiving an input signal and supplying an output signal, a decision unit receiving the output signal and having an output for supplying an output signal being a differential signal between the output and input signals of the decision unit, and an adaptive feedback branch receiving the differential signal and having status variables, coefficients and an output being coupled to the summation node.

Such adaptive networks are used, particularly in digital transmission systems with a so-called "noise predictor", to reduce the correlation in the noise signal. The basic layout of such a network is known in particularly from the publication entitled: "Design and Performance of an All Digital Adaptive, 2.048 MBIT/S Data Transmission System Using Noise-Prediction" by Graf and Huber in IEEE, 1989, CH2692-2/89/0000 pages 1808 through 1812, and is shown in FIG. 2 on page 1809 thereof, with an adder stage, a decision unit and an adaptive feedback branch. The adaptive feedback branch has a plurality of status variables and a plurality of coefficients.

Especially high demands are made of such networks, particularly in quantified feedback, since processing leads to error burst signals, which are due especially to the layout of the overall system and are formed as a result of propagation of the individual errors.

SUMMARY OF THE INVENTION

It is accordingly an object of the invention to provide an adaptive network, which overcomes the hereinafore-mentioned disadvantages of the heretofore-known devices of this general type and which is more error-tolerant than previous systems.

With the foregoing and other objects in view there is provided, in accordance with the invention, an adaptive network, comprising a summation node for receiving an input signal and delivering an output signal; a decision unit receiving the output signal of the summation node as an input signal and having an output for delivering an output signal being a differential signal between the input and output signals of the decision unit; an adaptive feedback branch receiving the output signal of the decision unit and having status variables, coefficients and an output; a changeover switch unit coupling the output of the feedback branch to the summation node; and a monitoring unit for monitoring an error magnitude of the output signal of the decision unit, the monitoring unit triggering the changeover switch unit in the next clock cycle if a first signal value having an amplitude exceeding a certain threshold value appears, for causing the summation node to be acted upon by a digital zero signal, for setting the status variables of the feedback branch to zero and for freezing the coefficients of the feedback branch.

In accordance with another feature of the invention, if the next value of the output signal of the decision unit no longer exceeds a second threshold value being at most equal to the first threshold value, then the output signal of the decision unit is supplied to the feedback branch and the adaptation of the coefficients is enabled, and the triggering of the changeover switch unit initially remains unchanged until the status variables of the feedback branch are again in a steady state.

In accordance with a further feature of the invention, there are provided changeover switches being selectively acted upon by a signal-carrying path or by a digital zero signal, the status variables being memory units each being preceded by a respective one of the changeover switches, and the changeover switch unit being controlled by the monitoring unit.

In accordance with an added feature of the invention, there are provided memory units each storing a respective one of the coefficients and each having an input and an output; adders each being associated with a respective one of the memory units and each having first and second inputs and an output; the output of each of the memory units being connected to the second input of the associated adder, the output of each of the adders being connected to the input of the associated memory unit; and changeover switches each being connected to the first input of a respective one of the adders, the changeover switches each having a first changeover contact being connected to a signal path and a second changeover contact being acted upon by a digital zero signal, and the changeover switches being controlled by an output signal of the monitoring unit.

In accordance with a concomitant feature of the invention, the monitoring unit includes a comparator for monitoring predetermined limit ranges of the output signal of the decision unit and for delivering an output signal; one memory unit receiving the output signal of the comparator and having an output delivering an output signal for controlling the feedback branch; an OR gate having first and second inputs and an output, the first input of the OR gate receiving the output signal of the one memory unit, and the output of the OR gate delivering an output signal for controlling the changeover switch unit; and a further memory unit feeding the output signal of the one memory unit to the second input of the OR gate.

Other features which are considered as characteristic for the invention are set forth in the appended claims.

Although the invention is illustrated and described herein as embodied in an adaptive network, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic and block circuit diagram of a configuration according to the invention; and FIG. 2 is a schematic and block diagram of an exemplary embodiment of the circuit configuration of FIG. 1 according to the invention.

DESCRIPTION OF THE PREFERRED EMBODIMENTS

Referring now to the figures of the drawing in detail and first, particularly, to FIG. 1 thereof, there is seen an input terminal 1 which is connected to a first input of an adder or summation node 2. An output of the adder is connected to an input of a threshold value decision unit 3. An output signal can be picked up at a terminal 10 at an output of the decision unit 3. An error signal 4 is an addition signal made up of the input signal and the negated output signal of the decision unit. This addition signal 4 is delivered to an input of an adaptive feedback branch 5 and to a monitoring unit 6. The monitoring unit 6 generates a first output signal which controls the adaptive feedback branch 5, and a second output signal 8 which triggers a changeover switch unit 7. The changeover switch unit 7 has two changeover contacts, of which a first contact is acted upon by an output signal 9 of the adaptive feedback branch 5, and a second changeover contact is acted upon by a constant digital zero. A center contact of the changeover switch is connected to the second input of the adder 2. FIG. 1 may also be viewed as having a decision unit which includes a threshold decision circuit 3 and the adder producing the output 4.

The essential features of the invention are found in the embodiment of the adaptive feedback branch 5 and the provision of the changeover switch unit 7 and the monitoring unit 6. The monitoring unit 6 is constructed in such a way that it monitors the error signal 4, which is generated by the decision unit 3, with respect to certain limits. If the signal exceeds this limit range, then the decision unit detects a first error signal. Upon the next clock signal, status variables of the adaptive feedback branch 5 are then set to zero, and coefficients of the adaptive feedback branch 5, which were stored in memory until then, are frozen for this clock cycle. Moreover, the changeover switch unit 7 is switched in such a way that a digital zero is applied to a second input of the adder 2. If in turn the next signal is an error signal, for which the same or a different threshold can be used, then this status is maintained. If allowable values are again applied to the input of the monitoring unit 6, then upon the next clock cycle, first the adaptive feedback branch 5 is re-activated, or in other words the status variables are again occupied by the triggered signals, and the coefficients are processed further with the values that were previously stored in memory. However, the changeover switch unit 7 remains in its "zero position" for one further clock cycle and thus is not switched back into its normal operation until the next clock cycle after that.

As a result, after an impermissible value occurs, then if the next value of the signal 4 no longer exceeds a second threshold value, which may be lower than or equal to the first threshold value, the signal 4 is delivered to the unit 5, and the adaptation of the coefficients is enabled through the control signal of the unit 6. However, the triggering of the changeover switch unit 7 remains unchanged initially, until the status variables of the unit 5 are again in a steady state, or in other words are filled with data from the signal 4.

In the manner described above, statistical errors can also be processed well, without entirely deactivating the adaptive feedback branch, or in other words the noise predicter. Burst signals are equally reliably detected by the configuration according to the invention, and when they occur, the entire feedback branch is completely deactivated during the burst signal. This reliably prevents errors from being adding on top of one another.

FIG. 2 shows a feature of the above-described circuit configuration according to the invention. Identical elements are identified by the same reference numerals. Once again, reference numeral 1 designates an input terminal, which is connected to a first input of a second adder 34. An output of the second adder 34 is connected to the first input of the first adder or summation node 2. The first adder 2 in turn is interconnected with the input of the decision unit 3, having the output at which the output signal can be picked up through the terminal 10. In addition, the output of the adder 2 is connected to a first input of a third adder 35. A second input of the third adder 35 is acted upon by the output signal of the decision unit 3, with a negative sign. The output signal of the decision unit 3 is moreover delivered to a decision feedback equalizer 11, having an output signal which is delivered to a second input of the second adder 34. The error signal 4 can be picked up downstream of a delay element 36 following the output of the third adder 35. The error signal 4 is delivered to respective first inputs of first and second multipliers 29, 28, to an input of a monitoring unit 6, and to a first input of a fourth adder 12. An output of the first multiplier 29 is multiplied by a constant 27 and delivered to a first changeover contact of a second changeover switch 25. A second changeover contact of the second changeover switch 25 is in turn acted upon by a digital zero. A center contact of the second changeover switch 25 is delivered to a first input of a fifth adder 23. The fifth adder 23 has an output which is connected on one hand through a first delay unit 21 to a second input of the fifth adder 23 and on the other hand to a first input of a third multiplier 18. An output of the third multiplier 18 is connected to a first input of a sixth adder 19. An output of the sixth adder 19 is connected to the first changeover contact of the changeover switch unit 7 and carries the output signal 9 of the adaptive feedback branch. This output signal 9 is delivered to a first changeover contact of a third changeover switch 14, having a second changeover contact which is again acted upon by a digital zero. A center contact of the third changeover switch 14 is connected through a second delay element or status variable 13 to a second input of the fourth adder 12. An output of the fourth adder 12 is delivered to a first changeover contact of a fourth changeover switch 15, having a second changeover contact which in turn is acted upon by a digital zero. A center contact of the fourth changeover switch 15 is connected on one hand to a first input of a fourth multiplier 17 and on the other hand through a third delay element or status variable 16 to a second input of the third multiplier 18. An output of the fourth multiplier 17 is interconnected with a second input of the sixth adder 19. The center contact of the fourth changeover switch 15 is also connected to a second input of the second multiplier 28. An output of the second multiplier 28 is multiplied by a second constant 26 and is delivered to a first changeover contact of a fifth changeover switch 24, having a second changeover contact which in turn is acted upon by a digital zero. A center contact of the fifth changeover switch 24 is connected to a first input of a seventh adder 22. An output of the seventh adder 22 is connected on one hand to a second input of the fourth multiplier 17 and on the other hand, through a fourth delay element 20, to a second input of the seventh adder 22.

The monitoring unit 6 has a comparator 33, which in this case monitors the input signal for an upper and a lower limit. If the predetermined range is exceeded, the comparator outputs a logical "1" and otherwise, it outputs a logical "0". This output signal is delivered to a fifth delay element 32, having an output which on one hand triggers the second through fifth changeover switches and on the other hand is delivered to a first input of an OR gate 30 and through a sixth delay element 31 to a second input of the OR gate 30. An output signal of the OR gate 30 forms the output signal 8 of the monitoring unit 6 and controls the first changeover switch unit 7.

The adaptive feedback branch includes the elements 12–29 and has the first and fourth delay elements or coefficients 21 and 20, which store the current coefficients in memory. These coefficients can be indicated by the following formula:

$$K_{20/21}(n) = K_{20/21}(n-1) + \mu \cdot T_{36} \cdot S_{15/16}.$$

In that formula, reference symbol K stands for the particular coefficient stored in memory in the respective delay unit 20 or 21, and reference symbol $\mu$ is the respective constant 26 or 27. Reference symbol $T_{36}$ stands for the output signal of delay element 36, and reference symbol $S_{15/16}$ stands for the particular signal delivered to the other input of the multiplier 28 or 29. The reference symbol n stands for the particular clock cycle. The status variables are defined by the second and third delay units. These units are in turn constructed as memories.

In order to reset the status variables to zero, in the triggering situation the changeover switches 14 and 15 set the inputs of the delay elements 13 and 16 to zero. In order to freeze the coefficients, the changeover switches 24 and 25 cause the coefficients 20, 21 to be added together with zero, as a result of which the current content in the memory units 20, 21 is maintained unchanged.

If the comparator 33 detects an error signal that is outside the defined limits, then a logical "1" is generated at its output. In normal operation, the comparator 33 generates a logical "0", which in turn has the effect that a logical "0" is also applied to the output of the OR gate 30, and all of the changeover switches 7, 24, 25, 14, 15 are closed. If a logical "1" is applied to the output of the comparator 33, then it is adopted with the next clock cycle upon the memory unit 32, and a logical "1" signal is applied to the first input of the OR gate 30 and is also present at its output, with the effect that the changeover switches 7, 14, 15, 24, 25 are opened, and their center contacts are acted upon with a zero. If upon the next signal 4 no error signal occurs, or in other words if the signal 4 is within the defined limits, then once again at the output of the comparator 33 a zero signal is output, and upon the next clock cycle, this signal is adopted at the first input of the OR gate 30, and thus the changeover switches 14, 15, 24, 15 are closed again. However, through the use of the second memory unit 31, the previously applied one-signal is conducted to the second input of the OR gate 30, and the changeover switch unit 7 still remains open for that clock cycle. It is not until a later successive regular signal 4 arrives that this changeover switch unit 7 is closed again as well.

We claim:

1. An adaptive network, comprising:

a summation node for receiving an input signal and delivering an output signal;

a decision unit including a decision circuit receiving the output signal of said summation node as an input signal and said decision unit having an output for delivering an output signal being a differential signal between the input and output signals of said decision circuit;

an adaptive feedback branch receiving the output signal of said decision unit and having status variables, coefficients and an output;

a changeover switch unit coupling the output of said adaptive feedback branch to said summation node; and a monitoring unit for monitoring an error magnitude of the output signal of said decision unit, said monitoring unit triggering said changeover switch unit in a next clock cycle if a first signal value having an amplitude exceeding a certain threshold values appears, for causing said summation node to be acted upon by a digital zero signal, for setting said status variables of said adaptive feedback branch to zero and for freezing said coefficients of said adaptive feedback branch.

2. The adaptive network according to claim 1, wherein if the next value of the output signal of said decision unit no longer exceeds a second threshold value being at most equal to the first threshold value, then the output signal of said decision unit is supplied to said adaptive feedback branch and the adaptation of said coefficients is enabled, and the triggering of said changeover switch unit initially remains unchanged until said status variables of said adaptive feedback branch are again in a steady state.

3. The adaptive network according to claim 1, including changeover switches being selectively acted upon by a signal-carrying path or by a digital zero signal, said status variables being memory units each being preceded by a respective one of said changeover switches, and said changeover switch unit being controlled by said monitoring unit.

4. The adaptive network according to claim 1, including:

memory units each storing a respective one of said coefficients and each having an input and an output;

adders each being associated with a respective one of said memory units and each having first and second inputs and an output;

the output of each of said memory units being connected to the second input of said associated adder, the output of each of said adders being connected to the input of said associated memory unit; and changeover switches each being connected to the first input of a respective one of said adders, said changeover switches each having a first changeover contact being connected to a signal path and a second changeover contact being acted upon by a digital zero signal, and said changeover switches being controlled by an output signal of said monitoring unit.

5. The adaptive network according to claim 1, wherein said monitoring unit includes:

a comparator for monitoring predetermined limit ranges of the output signal of said decision unit and for delivering an output signal;

one memory unit receiving the output signal of said comparator and having an output delivering an output signal for controlling said adaptive feedback branch;

an OR gate having first and second inputs and an output, the first input of said OR gate receiving the output signal of said one memory unit, and the output of said OR gate delivering an output signal for controlling said changeover switch unit; and a further memory unit feeding the output signal of said one memory unit to the second input of said OR gate.

\* \* \* \* \*